United States Patent [19]

Tran

[11] Patent Number: 4,769,723
[45] Date of Patent: Sep. 6, 1988

[54] MULTIPLEXED BUS DATA ENCODER AND DECODER FOR FACILITATING DATA RECORDING

[75] Inventor: David Q. Tran, Mesa, Ariz.

[73] Assignee: McDonnel Douglas Helicopter Co., Mesa, Ariz.

[21] Appl. No.: 814,547

[22] Filed: Dec. 30, 1985

[51] Int. Cl.$^4$ .......................... G11B 5/09; G11B 20/12
[52] U.S. Cl. ......................................... 360/39; 360/40; 360/41; 360/42
[58] Field of Search ....................... 360/39, 40, 41, 42; 375/55, 106, 108; 340/347 DD

[56] References Cited

U.S. PATENT DOCUMENTS

| | | | |
|---|---|---|---|
| 3,108,261 | 10/1963 | Miller | 360/51 |
| 3,646,546 | 2/1972 | Norris | 340/347 DD |
| 3,705,398 | 12/1972 | Kostenbauer et al. | 340/347 DD |
| 3,820,031 | 6/1974 | Smithlin | 340/347 DD |
| 4,038,494 | 7/1977 | Miller et al. | 375/55 |
| 4,310,860 | 1/1982 | Leiner | 360/40 |
| 4,500,871 | 2/1985 | Ratigalas | 340/347 DD |
| 4,501,000 | 2/1985 | Immink et al. | 340/347 DD |
| 4,562,489 | 12/1985 | Gaskell et al. | 360/39 |
| 4,641,128 | 2/1987 | Schouhamer | 340/347 DD |

Primary Examiner—Raymond F. Cardillo
Assistant Examiner—Surinder Sachar
Attorney, Agent, or Firm—Beehler, Pavitt, Siegemund, Jagger, Martella & Dawes

[57] ABSTRACT

Digital data recorded in Manchester code in a 1553 MUX bus has the data portion of each word converted into NRZ-L format with the synchronization prefix or portion of each word converted into a corresponding NRZ-L formatted portion according to a predetermined protocol. The NRZ-L formatted word, prefix and data, is then converted into DM-M coded format. The Manchester code NRZ-L coded data is driven at a 1-MHz clock frequency, while the DM-M coded format is driven at a 500 kHz clock frequency. The data in DM-M code is then recorded on magnetic tape in a test recorder. The magnetic tape can be analyzed at a remote site after test by decoding the DM-M word into its corresponding NRZ-L word driven at the 1-MHz clock rate. The synchronization portion of the reconverted NRZ-L word is identified and the NRZ-L word correspondingly assembled into an output register according to a predetermined protocol. The protocol used to reassemble the NRZ-L word in the register is distinct as between the prefix and the remaining portion of the word. The reassembled word is then clocked out of the register at a 2-MHz rate with the result that the synchronization prefix in invalid Manchester code is resynthesized and the assembled word is reconverted into Manchester code. As a result, Manchester coded data on a 1553 MUX bus can be recorded at lower frequency on magnetic tape and subsequently analyzed in such a manner that all the information on the bus is stored and retrieved in a manner that is substantially independent of the means of recordal.

18 Claims, 6 Drawing Sheets

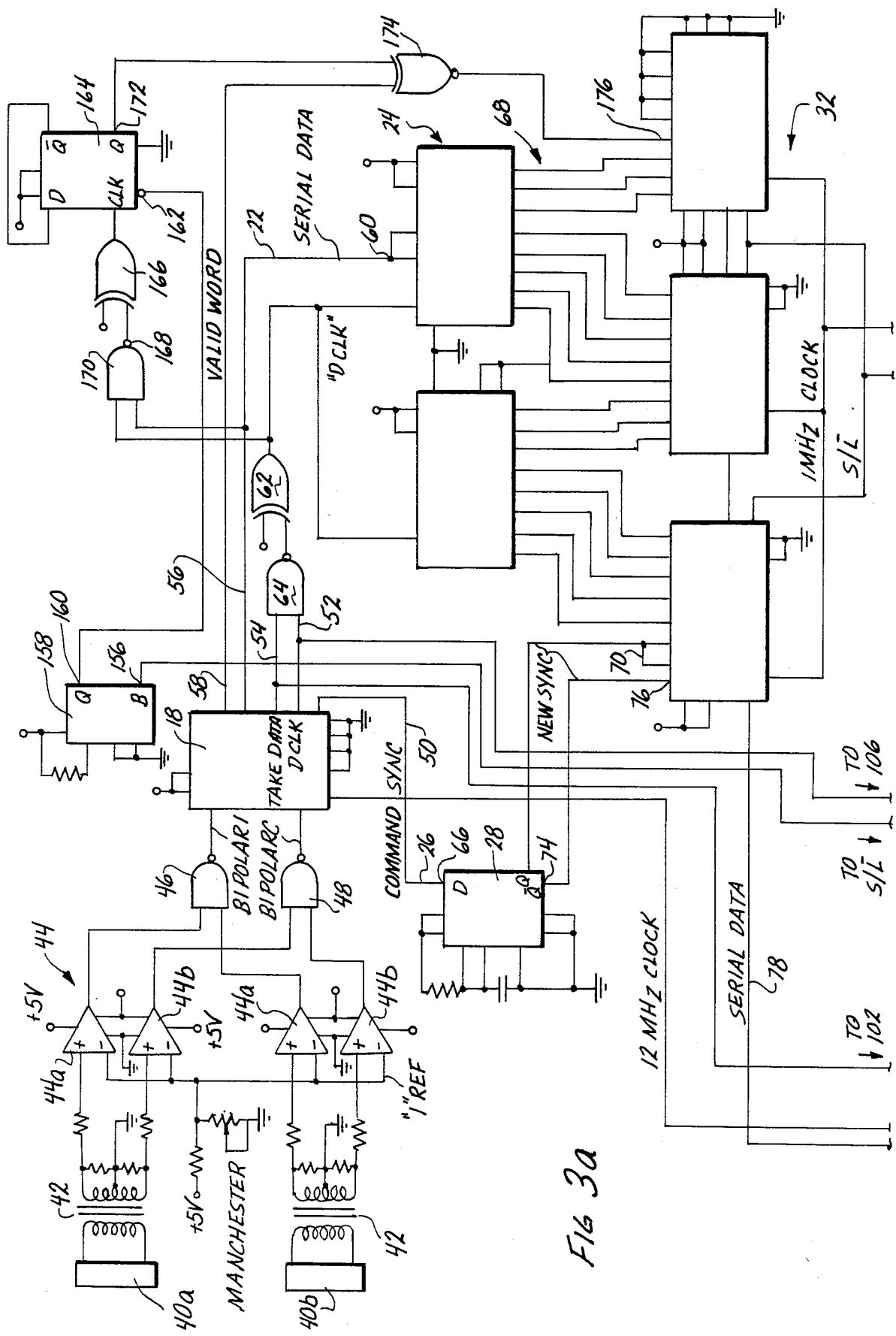

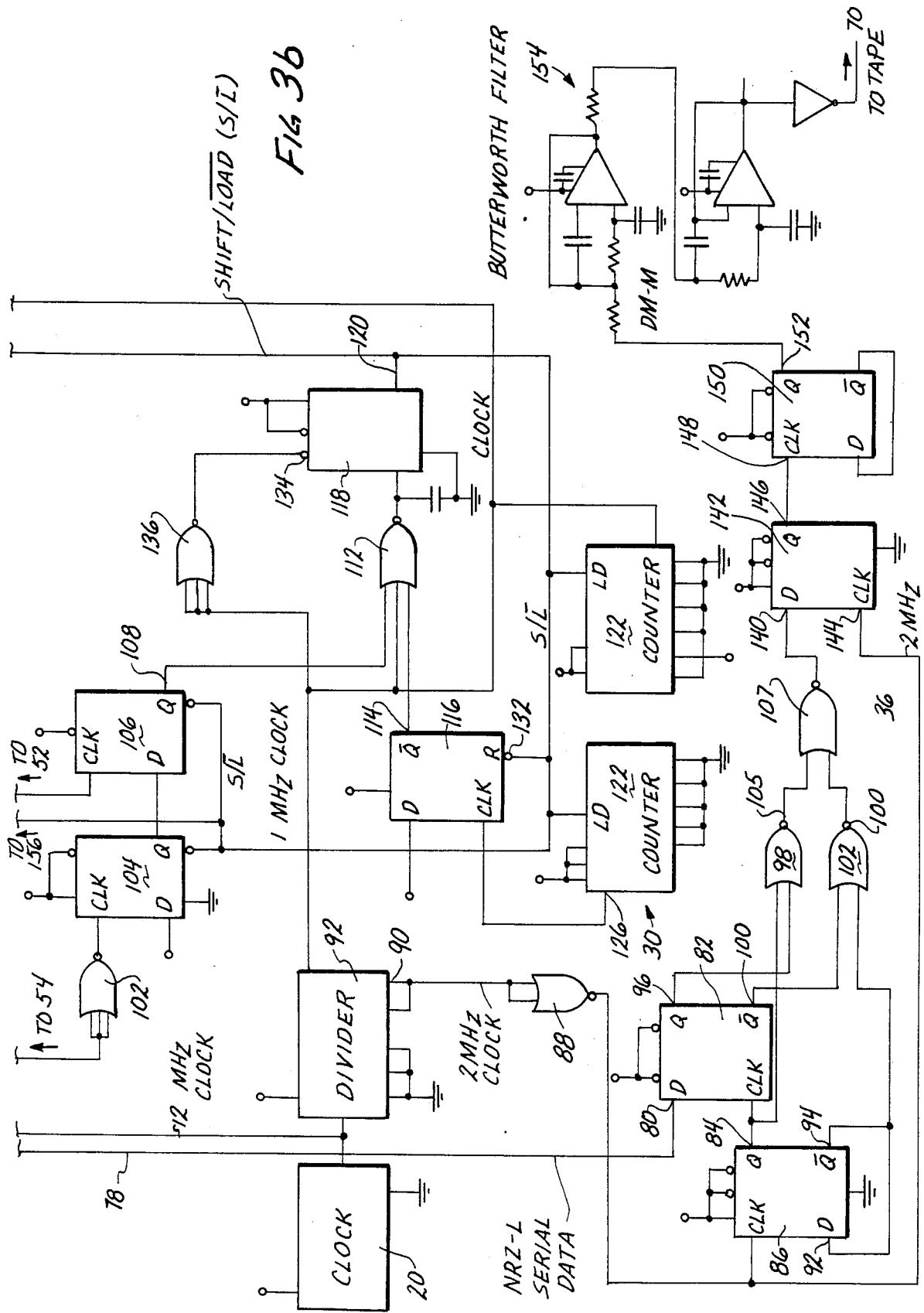

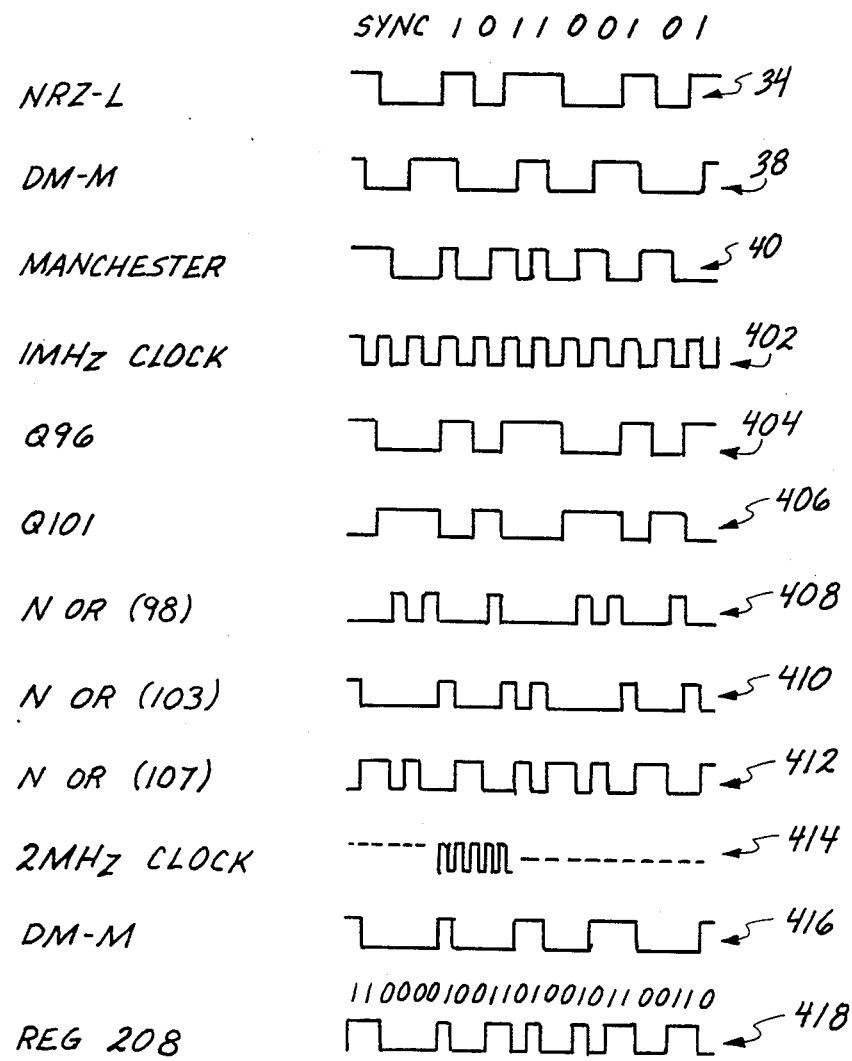

MULTIPLEXED BUS DATA ENCODER AND DECODER FOR FACILITATING DATA RECORDING

BACKGROUND OF THE INVENTION

1. Field of the Invention

The present invention relates to the field of multiplexed data encoders and decoders and in particular to such encoders and decoders as used in test flight recorders.

2. Description of the Prior Art

The prior art telemetry or test flight equipment, which is used to record multiplexed data on a military-standard bus (1553 MUX) generates enough information within approximately two minutes of recording time to fill a thirteen-track one- or two-inch magnetic tape which is driven at 120 inches per second. High tape speeds and fidelity is required to record the data inasmuch as the data is extremely broadband, ranging from DC to 1 MHz. Normally, the data is telemetered via a video broadcaster to a field receiving unit. Typically, the transmission of such video telemetered data is line of sight. However, broadcast telemetry is inherently limited by loss of information wherever ground or air transmission is temporarily blocked by an optical or other electromagnetic obstruction or interference.

The data may also be recorded on magnetic tape in a test flight recorder which is subsequently transported to a data processing center. However, such broadband data recordal on tape is difficult under field conditions and is error prone. There has been considerable prior art effort to reduce the effective frequency recorded on the magnetic tape is a manner so that errors are not introduced or data is not lost.

One prior art method is to put data from a multiplexed bus onto two tracks of a recording tape which is driven at 30 inches per second (ips). When the data is thus divided between two tracks, it then must be carefully reassembled to reconstruct the actual multiplexed bus data. This process is also difficult and extremely error prone. As a practical matter, only 80–85% of the data can be accurately reconstructed when a 1-MHz Manchester code is thus split into two tracks.

It is known in the art to convert digital coding in one format, such as NRZ code into other specialized formats for the purposes of hardwire transmission or intermediate storage on tape. Examples of such conversion can be found in Frazier, Jr., "System for Transmission, Storage and/or Multiplexing of Information U.S. Pat. No. 3,723,982 (1973); and Lacher, "Bipolar Time Modulated Encoder/Decoder System", U.S. Pat. No. 4,503,472 (1985). In particular, it is well understood that Manchester or other biphase coding can be converted into NRZ formats and then the data in NRZ format processed for the purpose of signal conditioning or data processing. Examples of this conversion and use is shown in Perkins et al., "Data Converting and Clock Pulse Generating System", U.S. Pat. No. 3,659,286 (1972); Norris, "Split Phase Adaptive Decoding Electronics", U.S. Pat. No. 3,646,546 (1972); and Kostenbauer et al., "Digital Formal Converter", U.S. Pat. No. 3,705,398 (1972).

It is also recognized in the art that certain coding formats are recognized as having a higher data bit packing density on magnetic tape than Manchester codes. For example, in Miller, "Recording and/or Reproduction System", U.S. Pat. No. 3,108,261 (1963), the DM-M code is described as having such a higher data bit packing density.

The particular problem is that in the Military Standard 1553 MUX the data word is characterized by a singularly defined format. For example, in Military Standard 1553 the word format is a Manchester-2 biphase level. A logical 1 is transmitted as a bipolar coded signal, 1/0, that is a positive pulse followed by a negative pulse. A logical zero is coded as the signal, 0/1, that is a negative pulse followed by a positive pulse. A transition through the zero voltage level occurs at the midpoint of each bit interval. In the 1553 Mux the digital transmission rate is at one megabit per second. Each word is 16 bits concatentated with a synchronization waveform prefix and a suffix parity bit suffix for a total of 20 bit time intervals. The synchronization waveform is a three-bit interval, invalid Manchester pattern. This synchronization waveform, which is an invalid Manchester code, may have different formats in different types of words depending upon whether the Military Standard 1553A or 1553B is used.

In all prior art applications where the conversion from one code to another is considered and in particular when a conversion from Manchester Code to NRZ or to another code is considered, it is assumed that there exists a uniform methodology for converting each portion of each word. Therefore under prior art methods, if Manchester Code is to be encoded into an intermediary code format for recordal on tape, the synchronization information will be lost or garbled.

Therefore, what is needed is some means whereby data generated at a 1-MHz date rate, such as Manchester code, can be converted when used in word formats having invalid code sections, such as in the Military Standard 1553, to a more compact code density for tape recordal. Following tape recordal, then, additional means and methodologies are required to decode the data from the intermediary code back into Manchester coding such that the invalid synchronization prefix is appropriately reassembled.

BRIEF SUMMARY OF THE INVENTION

The invention is a circuit for encoding a digital signal on a bus which signal is coded in a first format at a first clock rate. The digital signal includes a synchronization portion or prefix which is coded in a format invalid in the first format. The circuit comprises an encoder circuit for converting a selected portion, such as the data portion, of the digital signal into a synthesized digital signal coded in a second format at a second clock rate. The selected portion does not include the synchronization portion. The first clock rate is greater than the second clock rate. A synthesis circuit is provided for synthesizing a new synchronization portion or prefix of the synthesized digital signal from the synchronization portion of the digital signal according to a predetermined protocol. The synthesis circuit is coupled to the encoder circuit. A circuit for recording the synthesized digital signal is also included. The circuit for recording is coupled to the decoder circuit and synthesis circuit.

By this combination of elements the data originally generated at the higher first clock rate is reduced and synthesized to include the invalid synchronization portion in a format characterized by a reduced clock rate so that the circuit for recording the synthesized digital signal may have a lower frequency or data rate capability.

The circuit further comprises a decoder circuit for converting the digital signal in the second format at the reduced second clock rate into the first format of the higher originating first clock rate. A resynthesis circuit coupled to the decoder circuit is provided for resynthesizing the synchronization prefix in the invalid format. The decoder circuit is coupled to the circuit for recording.

As a result data at the original higher first clock rate may be recorded by the circuit for recording and reconverted into the original format so that processing of the data appears to be independent of the circuit for recording the data.

More particularly the encoder circuit comprises a first encoder for converting signals in a Manchester coded format on a 1553 MUX bus into NRZ-L formatted signals. A second encoder is coupled to the first encoder and is used for converting the NRZ-L formatted data into DM-M formatted data run at the reduced second clock rate rather than the first clock rate of the Manchester and NRZ-L formatted signals.

The decoder circuit comprises a first decoder for reconverting the digital signal from DM-M code format at the second clock rate into NRZ-L format at the first clock rate; and a second decoder for reconverting the NRZ-L format digital data into the Manchester coded data at the first clock rate.

The resynthesis circuit comprises a circuit for recognizing the synthesized synchronization portion; and a circuit for resynthesizing the synchronization portion in the invalid code format at the higher first clock rate. The circuit for resynthesizing the invalid synchronization portion is coupled to the circuit for recognizing.

The synthesis circuit generates a new synchronization portion in the new second coded format according to an arbitrarily predetermined shift in logic transition timing within the synchronization portion.

The resynthesizing circuit resynthesizes the synchronization portion by shifting logic transitions within the synchronization prefix back to the original first coded format.

The circuit for recognizing the synchronization portion comprises a flip-flop coupled to the encoder circuit. The flip-flop assumes a first logic state upon receipt of a signal representation of a command synchronization portion, and assumes a second logic state upon receiving a signal representative of a data synchronization portion. The circuit for synthesizing the new synchronization portion comprises an output register coupled to the encoder circuit wherein the new format digital word is stored within the register and wherein a selected portion of the register is reserved for the new synchronization portion. The selected portion of the register is coupled to the output of the flip-flop in a predetermined mapping between the selected bit portions of the register and the outputs of the flip-flop.

The circuit for recognizing the synthesized synchronization portion comprises a register and a plurality of logic gates coupled to selected bit outputs of the register. The synthesized synchronization portion has a predetermined logic pattern. The plurality of logic gates generate an output signal in response to the occurrence of the predetermined pattern on the selected portion of bit outputs of the register. The circuit for resynthesizing the invalid synchronization portion comprises a register having a plurality of bit input terminals. Each bit input terminal corresponds to a predetermined fraction of a data bit interval. The selected portion of the bit input terminals is selectively provided with corresponding logic levels from the synthesized prefix according to an inverse of the predetermined pattern for synthesizing the synchronization prefix.

The invention includes a method for conveying digital data generated at a first site to a second site. The digital data is encoded according to a first selected format. The format is organized into a plurality of words. Each word includes a synchronization prefix. The synchronization portion has a code format logically distinct from the coding format with respect to the remaining portion of each the word. The synchronization portion is defined in an invalid format. The method comprises the steps of converting all of the digital data in the first coded format into a second coded format, and synthesizing the invalid synchronization portion into a synchronization portion in a formatted code logically consistent with the second coded format. The synthesis is made according to a predetermined protocol. The second coded format is driven by a clock rate reduced as compared to tht of the first coded format. The method continues with the step of conveying the digital information in the second coded format to the second site.

The digital information in the second coded format is reconverted into the first coded format; and the synchronization portion in the second coded format is resynthesized into the first coded format according to an inverse of the predetermined protocol. As a result the digital information is conveyed between the first and second sites and is converted and reconverted from an into the first coded format in a manner substantially independent of the step of conveying.

The step of converting the digital information into the second coded format comprises the steps of converting the digital information into NRZ-L coded format, and the step of synthesizing the synchronization word comprises the step of synthesizing a corresponding synchronization portion to the word in the NRZ-L format, and converting the synchronization portion and remaining portion of the word in NRZ-L format into DM-M format. The step of reconverting the digital information from the second coded format to the first coded format comprises the steps of converting the information in DM-M coded format into NRZ-L coded format, identifying the synchronization portion, and resynthesizing the synchronization portion thus identified into the first coded format according to the predetermined protocol.

The invention is also characterized as a method of recording data in a test recorder, where the digital data is generated at a first clock frequency. The method comprises the steps of converting the data at the first coded format into data at a second coded format driven at a reduced clock frequency; recording the data recorded at the reduced clock frequency on magnetic tape; conveying the magnetic tape from a site of recordal to a distant site of analysis; playing the data coded in the second format from the tape into a decoder; and converting the data on the second coded format into the first coded format within the decoder.

The steps of converting the digital signal in the first coded format including converting a synchronization portion of the digital signal which is coded according to a distinct format from the remaining portion of each digital signal. The step of converting the synchronization portion converts it into format logically consistent coded with the second format according to a predetermined protocol.

BRIEF DESCRIPTION OF THE DRAWINGS

FIGS. 3a and 3b are a schematic diagram of an encoder incorporating the invention.

FIG. 5 is a timing diagram of selected signals in the circuitry of FIGS. 3a–b and 4a–b.

The invention and its various embodiments may be better understood by now turning to the following detailed description.

DETAILED DESCRIPTION OF THE PREFERRED EMBODIMENTS

Figure 1:
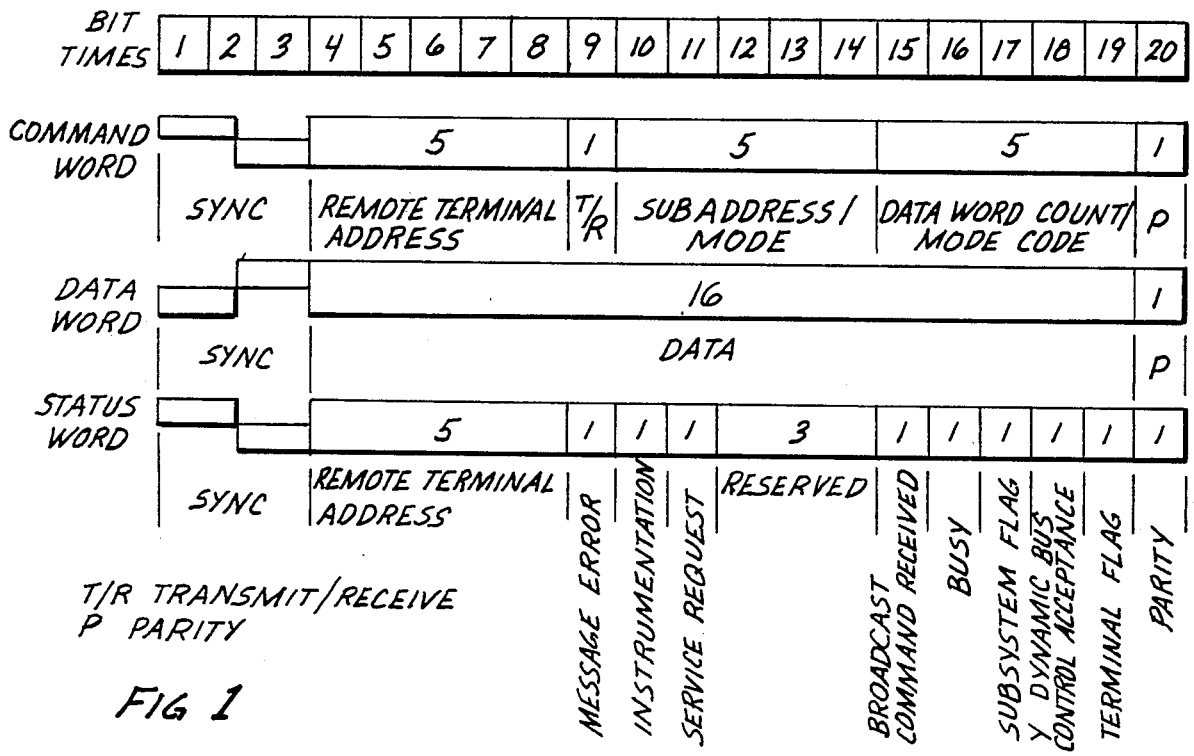
FIG. 1 is a diagrammatic section of word formats as used in the Military Standard 1553.

The 1553 MUX is an aircraft military standard command/response multiplex data bus which is used for integration of weapon systems, flight controls, propulsion controls, and storage management subsystems. As illustrated in FIG. 1, the 1553 MUX standard each word is comprised of 16 bits of data, a synchronization pattern of three bits and a parity bit for a total of 20 bits per word. The three bit synchronization word is in a unique coded form which does not follow the Manchester form in which data or parity is coded. The three bit synchronization prefix is comprised of a signal having a first level for a time period of 1½ bit intervals followed by a transition to the opposing logic level for another 1½ bit intervals. The remainder of the word is coded in the Manchester code.

Figure 2:
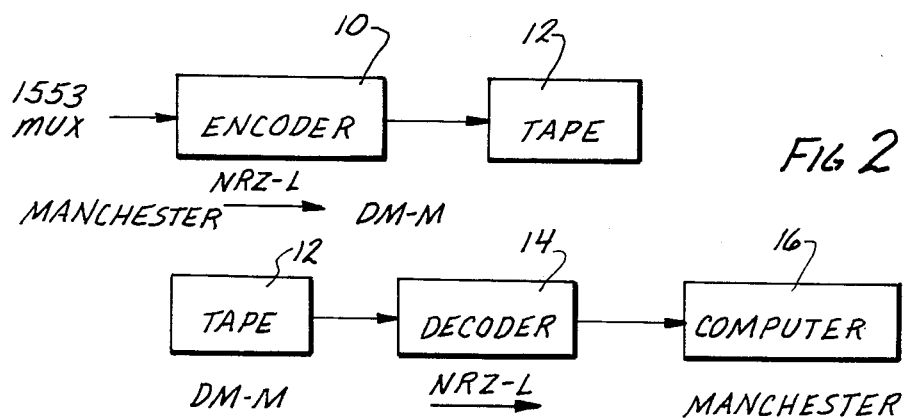
FIG. 2 is a diagrammatic block depiction of the methodology and apparatus of the invention.

Turn now to FIG. 2. According to the invention, data from the 1553 MUX is coupled to an encoder 10 which converts it into NRZ-L and then into DM-M code whereupon it is recorded in the field on a single magnetic track of reel-to-reel tape 12. Tape 12 is then removed to another location, e.g., the data processing center, the input into a decoder 14, which transforms the DM-M encoded information from the tape into NRZ-L and then Manchester code which is then available for computer analysis in computer system 16.

Thus, the present invention comprises a means for recording high frequency digital information on a single track at a lower frequency than that at which the data originally occurred. In fact, in the invention the tape data or clock rate is characterized by a maximum bit frequency of 500 kHz. This results from converting Manchester code into DM-M code.

DM-M code (delay-modulation-marked Miller code) is a code wherein a logical one is represented by a level change at the mid-bit time while zero followed by a zero is represented by a level change at the end of the first bit interval corresponding to the first zero. There is no level change when a zero is preceded by one.

Turn now to the schematic drawings. FIGS. 3a–b are a schematic of encoder 10 and FIGS. 4a and b are a schematic of decoder 14. The operation of decoder 14 and encoder 10 will first be described in a broad qualitative sense.

Manchester code is input to a conventional Harris Manchester encoder-decoder chip 18. Harris chip 18 converts Manchester code into NRZ-L code. Harris chip 18 is timed by a 12 MHz clock 20. The Harris chip operates to convert the sixteen data bits of the twenty-bit Manchester word into NRZ-L. Command signals are generated corresponding to interpretations of the synchronization prefix and parity bit. The data portion is provided as serial data on line 22 and is coupled to a serial-to-parallel converter 24. A COMMAND/DATA SYNC signal is coupled on line 26 to flip-flop 28. Through appropriate timing circuitry, generally denoted by reference numeral 30, the assembled sixteen-bit data word is transferred to a parallel-to-serial converter 32. Since the three-bit synchronization prefix is in an invalid Manchester format, it is reconstructed as a special NRZ-L three-bit synchronization pattern according to a predetermined pattern as shown at line 34 in the timing diagram of FIG. 5 for a portion of a Manchester encoded word comprised of the synchronization prefix and the data 101100101 ... as depicted in line 40 of FIG. 5. The decoder shown in FIGS. 4a and b essentially reverses the process.

By comparing the DM-M code in line 38 of FIG. 5 to the corresponding Manchester code in line 40, it can easily be seen that in the worst case the frequency has been halved. However, the conversion has occurred in such a manner that the synchronization information is preserved.

It should be noted that it is one of the results of this system that it is "tape invisible". In other words, whatever appears on the 1553 MUX will eventually appear at the output of the decoder of FIGS. 4a and 4b. This includes even those situations in which there are errors, garbage, parity bit errors and the like. It is not necessary for the data on the MUX to be good. The present system records exactly whatever is seen. This feature is particularly useful in trouble shooting and analyzing the performance of complex electronic circuitry in the field whose performance is recorded by means of this system. All the errors are preserved in an original form, notwithstanding conversion, no data errors are lost in the conversion, nor are errors inserted by the conversion.

Consider now a more detailed description of the operation of the circuitry described in connection with FIGS. 3 and 4. Turning particularly to FIG. 3a, a biphase 1553 primary bus 40a and secondary bus 40b is shown as coupled through center tapped balance transformers 42 to differential amplifiers 44a and b. Digital information is multiplexed between the two buses 40a and 40b. Amplifier 44a will have a logical high output when a logical one is received while amplifier 44b will have a logical high output when a logical zero is received from bus 40. The outputs of amplifier 44a are each coupled to NAND gate 46 while the outputs of amplifier 44b are each coupled to the inputs of NAND gate 48. Therefore the output of NAND gate 46 is an active low logic signal indicating a bipolar one, while the output of NAND gate 48 is an active low signal indicating a bipolar zero.

The outputs of NAND gates 46 and 48 are coupled respectively to the bipolar one and zero inputs of a conventional Harris chip, Model HD-15530 as manufactured by Harris Semiconductor Products Division of the Harris Corporation. Harris chip 18 is a CMOS device which includes a decoder. The decoder within Harris chip 18 recognizes the Military Standard 1553 synchronization pulse and identifies it as well as decoding data portion of the word and checking parity. The decoder within Harris chip 18 is driven by a 12 MHz clock 20 in order to accommodate the 1 MHz input data according to the design of Harris chip 18. Harris chip 18 is free-running and continuously monitors its data input lines from NAND gates 46 or 48 to begin an output cycle. When a valid synchronization prefix is recognized, it is decoded as either corresponding to a command/status word or data word as depicted in FIG. 2. The decoding or identification of the synchronization prefix is indicated on output 50, as the signal, COMMAND/DATA SYNC. If the synchronization character corresponds to a command word the output on line 50 will be high and remain high for 16 decoder shift clock periods, defined as the decoder clock output appearing on output line 52, the signal DCLK. The signal, TAKE DATA, on output line 54 will go high and remain high while decoder 18 is transmitting decoded data on output line 56. The decoded data on output line 56 is a signal, DATA OUT. The decoded data on line 56 is in serial NRZ-L format. The signal, decoder shift clock, DCLK, is provided so that the decoded data bits can be shifted into an external register on every low-to-high transition of this clock.

After all 16 decoded data bits have been transmitted, the data is checked by decoder 18 for odd parity. A high on output line 58 indicates a successful reception of the word without any parity errors. This is the signal, VALID WORD. At this time, decoder 18 waits for a new synchronization prefix to start another output sequence.

SERIAL DATA OUT is therefore coupled to the serial input data terminal 60 of register 24. Register 24 is clocked by the output of an EXCLUSIVE OR gate 62, one of whose inputs is held permanently high. The other input of gate 62 is coupled to the output of NAND gate 64. One input of NAND gate 64 is coupled to the signal TAKE DATA, line 54, and the other input of NAND gate 64 is coupled to the signal DCLK, line 52. Therefore, while SERIAL DATA OUT is active, TAKE DATA is high. The clock signal, DCLK, will thus be inverted by NAND gate 64 and again inverted by gate 62 to provide a delayed clock signal, DCLK, to the clock input of register 24.

The NRZ-L formatted data of the signal SERIAL DATA OUT and DCLK are synchronized and thus the SERIAL DATA WORD is assembled within register 24. Meanwhile the signal COMMAND/DATA SYNC has been coupled to the D input 66 of flip-flop 28.

Register 24 has 16 outputs, generally denoted by reference numeral 68, which are coupled in parallel to 16 inputs of parallel-to-serial register 32. A 17th and 18th input, generally denoted by reference numeral 70, of register 32 is coupled to the Q output 72 of flip-flop 28. The inverted Q output 74 of flip-flop 28 is similarly coupled to the 19th input 75 of register 32. Output 78 of register 32 is thus a clocked serial output, still in NRZ-L format, but in which the synchronization bit has been synthesized according to a predetermined protocol. For example, in the case where the synchronization bit is a command word or status word which is shown in FIG. 2 as one and one-half bit in logical one followed by one and one-half bit in logical zero, when in Manchester II code, it will be converted and the pseudo NRZ-L code of the invention converts the synchronization bit into a logical one for one data bit interval followed by two logical zeroes. In other words, the midpoint transition of the synchronization bit is moved half a bit interval forward. The timing diagram of FIG. 5 illustrates by comparison of lines 34 and 40 the synthesization which is made. Many other synthesizations of the synchronization prefix may be made without departing from the scope and spirit of the invention.

Consider now the timing circuitry 30 in FIGS. 3a and 3b. Operation of timing circuitry 30 is based upon 12 MHz clock 20. The clock output signal from clock 20 is divided down by divider circuitry 92 and includes an output 100 which is a 1 MHz clock. The TAKE DATA signal on line 54, which is valid while 16 bits of data are output from Harris chip 18, is coupled through to the NOR gate 102 used as an inverter to clock input of D-type flip-flop 104. The Q output of flip-flop 104 is in turn coupled to the D input of flip-flop 106. Flip-flop 106 in turn is coupled by the decoder clock signal, DCLK, on line 52. Flip-flop 104 is clocked on the rising edge of its clock input which is therefore the end of the TAKE DATA signal. The D input is held high so that upon the end of a data output cycle from Harris chip 18, Q is clocked high in flip-flop 104. Flip-flop 106 will synchronize this end of data transmission signal with the decoder shift clock signal, DCLK. Flip-flop 106 has its inverted Q output 108 coupled to one input 110 of NOR gate 112. The other inputs of NOR gate 112 are coupled to the one MHz clock output 100 from divider 92 and inverted Q output 114 of flip-flop 116. As will be described below, flip-flop 116 is used as a RESET signal. The output of NOR gate 112 is used as the clock input signal to flip-flop 118. The D input of flip-flop 118 is held high. Therefore, at the end of the transmission cycle the inverted Q output 120 of flip-flop 118 goes active low at the appropriate time as determined by the clocks just described. Output 120 of flip-flop 118 is coupled to and parallel-to-serial register 32. The output 120 is a shift/load signal, S/L. As described below, SHIFT/LOAD will go active when 20 bits have been accumulated within register 32. This will cause the stored 20 bits to then be serially shifted out into the DM-M converter 36 also described below.

The one MHz clock 100 is coupled to registers 32 and serves as the clocking signal for these registers. In addition the 1-MHz clock output 100 is also coupled as an input 124 to counter 122. Counter 122 will count up to 20 thereby indicating that a full 1553 MUX word has been clocked into or out of register 32. Upon reaching a count of 20 output 126 will go high and act as activating clock signal for flip-flop 116. When clocked, flip-flop 116 will coupled the D input, which is held high, through to the inverted Q output. Thus, NOR gate 112 would previously be held inactive by the high output of the inverted Q output 114 but will be uninhibited when flip-flop 116 is clocked by counter 122. Therefore, after the 20 bits have been counted a SHIFT/LOAD signal will be generated at output 120.

The SHIFT/LOAD signal at output 120 also serves as a reset and load signal. For example, if the SHIFT/LOAD signal is coupled to the load inputs 28 of counter 122 thereby rezeroing counter 122 and allow it to accumulate another 20 counts of the clock signal at input 124. The SHIFT/LOAD signal is also coupled to the reset inputs of flip-flops 104, 106. Therefore, after 20 bits have been accumulated and shifted out flip-flops 104, 106 will be reset in preparation for the receipt of the next word. Flip-flop 116 is also reset by the SHIFT/LOAD signal, thereby inhibiting NOR gate 112. Flip-flop 118 is reset by the 1 MHz clock signal 100 which is coupled to its reset terminal 134 through NOR gate 136 used as an inverter. Flip-flop 118 thus produces a single pulse SHIFT/LOAD signal one each 20 clock cycles but timed appropriately through flip-flops 104, 106 and NOR gate 112 with actual serial data output from Harris chip 18.

Thus, serial data is output on line 56 and assembled within serial-to-parallel register 24. The reconstructed NRZ-L formatted word is thus assembled within register 32 and after all 20 bits have been resynthesized in NRZ-L format the SHIFT/LOAD signal clocks the bits out in serial form on line 78.

The circuitry also provides a means for correctly synthesizing the parity bit. Whenever a SHIFT/LOAD signal is generated at output Q120, on flip-flop 118 of FIG. 3b, the same SHIFT/LOAD signal is provided to the B input of the one-shot flip-flop 158. A single pulse is provided at the Q output 160 of flip-flop 158 which will be indicative of the assembly of a complete word within register 32. The Q output 160 of flip-flop 158 in turn is coupled to the reset active low input 162 of flip-flop 164. Flip-flop 164 is a toggle which is clocked by the output of exclusive OR gate 166. One input of exclusive OR gate 166 is held high so it acts as an inverter. The other input of gate 166 is coupled to the output 168 of NAND gate 170. NAND gate 170 has the inputs DCLK and serial data out. Therefore flip-flop 164 will be toggled with each binary one in any output data. An even number of toggles will leave Q outputs 172 of flip-flop 174 even, while an odd number of toggles will leave it odd. Output 172 of flip-flop 162 is coupled to one input of EXCLUSIVE OR gate 174. The other output of gate 174 is coupled to the command word, VALID WORD, on line 58. If a valid word is output by Harris chip 18 the output of flip-flop 164 will be odd and provided as a correct parity bit to the least significant bit position 176 of register 32. If Harris chip 18 indicated that the parity was in error, the command signal, VALID WORD, will be low. Therefore, if the serial data output of Harris chip 18 as determined by flip-flop 164 was even, the odd output of Q output 172 will be directly coupled through gate 174 into the least significant bit position 176 of register 32. In this manner, the correct parity is always input into register 32 whether or not the parity check was correct within Harris circuit 18.

The synthesized word is then converted into DM-M format. Output 90 of divider 92 is provided with a 2-MHz clock signal. This clock signal is inverted by NOR gate 88 and provided to the clock input of flip-flop 86. Flip-flop 86 acts as a toggle since it has its inverted Q output to 94 coupled to its D input 92. Therefore the Q output 84 of flip-flop 86 is a 1-MHz clock signal. The Q output of flip-flop 84 is thus provided with a clock signal to a flip-flop 101. D input 80 of flip-flop 101 is coupled to line 78 and receives the synthesized serial NRZ-L word. Q output 96 of flip-flop 101 is coupled to one input of NOR gate 98. The other input of NOR gate 98 is coupled to the 1-MHz clock signal from Q output 84 of flip-flop 86. Similarly, the inverted Q output 101 of flip-flop 82 is coupled to one input of NOR gate 103. The other input of NOR gate 103 is coupled to the inverted Q output 94 of flip-flop 86.

The operation of the gates and flip-flops in combination is best illustrated in the timing diagram of FIG. 5. For example, consider line 40 which shows an NRZ-L formatted signal input to D input 80 of flip-flop 82. The signal is representative for example of the data string 101100101. Below line 40 is line 402 representing the 1-MHz clock from Q output 84. Line 404 thus represents Q output 96 from flip-flop 82 while line 406 represents the inverted Q output 101. The output of NOR gate 98 can be analyzed by considering NOR gate 98 disabled whenever the clock input is active. When NOR gate 98 is enabled at the low clock cycle, it then acts as an inverted. The result is output 105 of NOR gate 98 is represented by line 408 in FIG. 5. The output of NOR gate 98 is low whenever the data signal is low and the data ones will then be represented by an active pulse at the half data bit intervals. In other words, and output of NOR gate 98 implements the logical rule by representing a one by a rising mid bit pulse and is logically zero everywhere else.

Similarly, the output of NOR gate 103 can be considered as inhibited by the Q inverted output 94 which is the inverse of the 1-MHz clock. Thus, line 410 of FIG. 6 represents its output. An active pulse will be generated at the output of NOR gate 103 at the beginning of each half data bit interval on the occasion of a logical zero in the data stream and otherwise shall be logically zero everywhere else.

The output of NOR gates 98 and 103 are combined within NOR gate 107. The output of NOR gate 107 will be high only when both inputs are low. Thus, line 412 represents the logical function of NOR gate 107.

The data is still not in DM-M format. The output of NOR gate 107 is provided to the D input 140 of flip-flop 142. Clock input 144 of flip-flop 142 is coupled to the output of gate 88 and is thus the 2-MHz clock signal represented by line 414 of FIG. 6. Thus, clock input 144 of flip-flop 142 has a rising edge at the beginning and midpoint of each data interval. Q output 146 of flip-flop 142 will thus be synchronized to change state exactly on the beginning and midpoint data intervals but will otherwise simply copy the D input to flip-flop 142. The Q output 146 is coupled to the clock input 148 of a toggle flip-flop 150. Q output 152 of toggle flip-flop 150 will be the DM-M coded output corresponding to the NRZ-L data provided on line 78. Flip-flop 150 will toggle on each rising edge of its clock signal, namely line 412 of FIG. 5, to produce an output at through output 152 as depicted by line 316 of FIG. 5. By comparison of the DM-M coding at line 316 with the binary data appearing at the top of FIG. 5, it can be readily confirmed that this is in fact DM-M coded format.

Q output 152 of flip-flop 150 in turn is coupled to a conventional buffer which is used to generate an appropriately matched signal which is coupled to conventional tape recorder heads. The DM-M encoded data, which represents all the data on the 1553 MUX bus 40a and 40b, is therefore recorded on the tap. However, it should be noted that data is provided with 1 MHz clock rate on line 78. Therefore, in the worst case data can be provided to input 148 of toggle flip-flop 150 at a 1-MHz rate. Toggle flip-flop 150 divides the worst case frequency in half so that the maximum data transfer rate at the output of flip-flop 150 is 500 kHz in the DM-M format. Thus, according to the invention, the bandwidth of the data is reduced by half without any loss of data information.

Figure 4A:
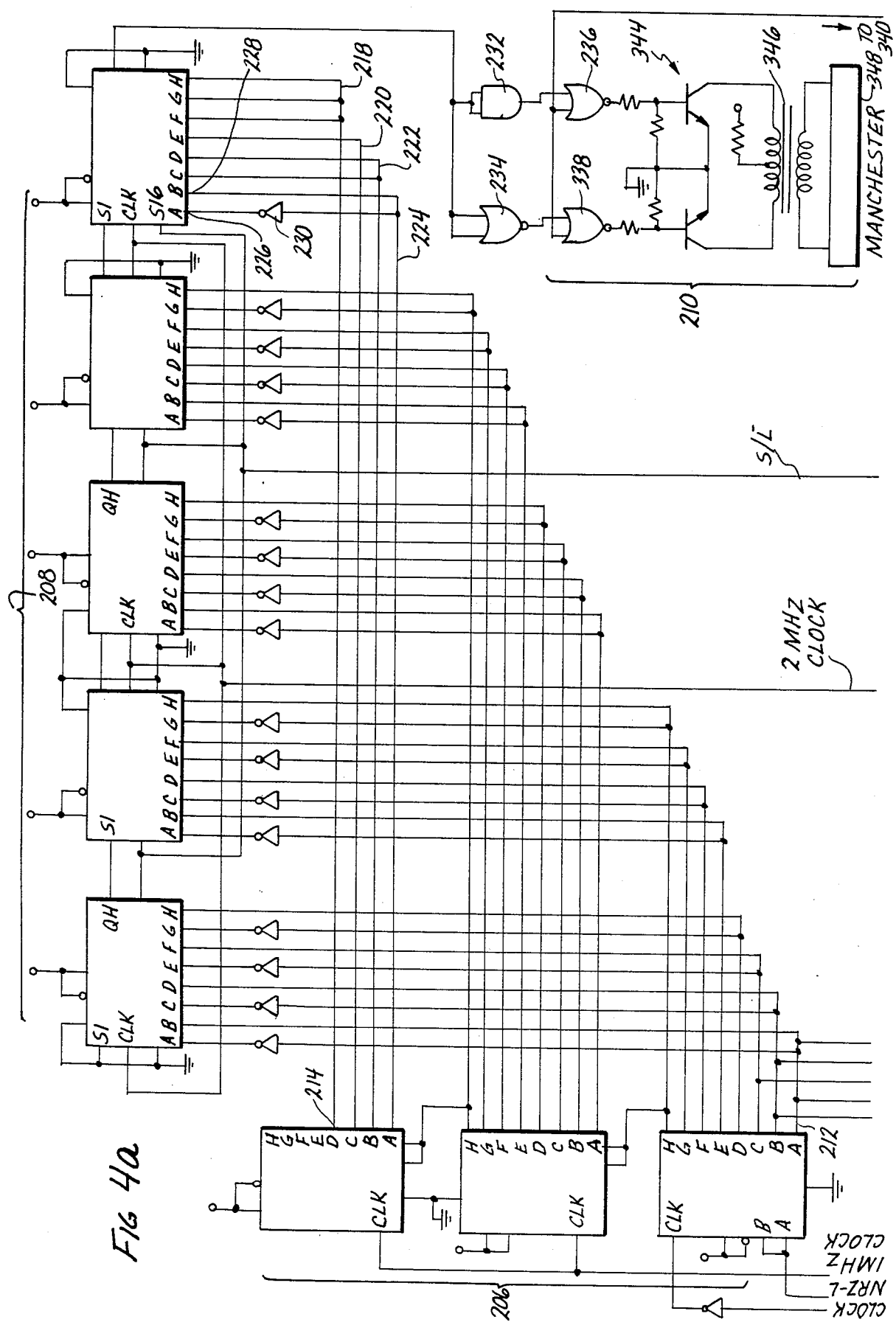
FIGS. 4a and 4b are a block diagram of a decoder incorporating the invention.
Figure 4B:
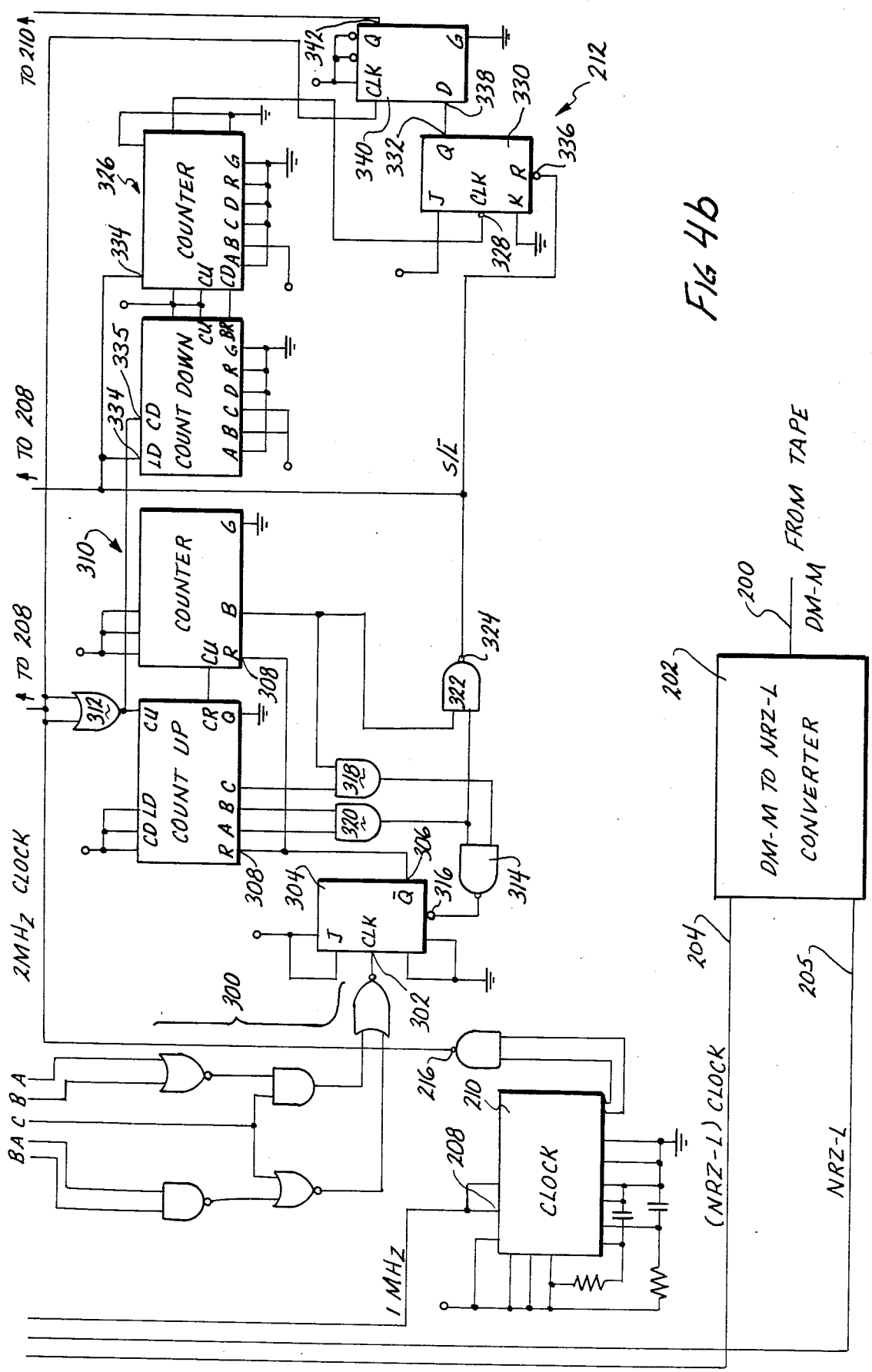

Turn now to the decoder of FIGS. 4a-b, wherein DM-M encoded data is read from magnetic tape and converted into Manchester code for coupling to the 1553 MUX bus. The DM-M encoded data is provided at input 200 of a synchronization circuit 202, well known to the art, which converts the DM-M data into NRZ-L format at outputs 204 together with a corresponding NRZ-L clock at output 205. Such decoder circuits are sold, for example, by DSI as Model No. 7136-1000 and will not be further described.

The NRZ-L formatted data is then provided as input to a serial-to-parallel register, generally denoted by reference numeral 206. The 20-bit NRZ-L word is then assembled within register 206 and clocked in parallel into a parallel-to-serial register, generally denoted by reference numeral 208. The data is then clocked from register 208 in a manner according to the invention as described below to be constructed in Manchester serial format and provided to the inputs of a 1553 MUX bus driver, generally denoted by reference numeral 210. This clocking is established by logic clocking circuit generally denoted by reference numeral 213.

The NRZ-L data is fed in serial formal to serial-to-parallel converter 206. Converter 206 in turn is clocked by a 1-MHz clock signal provided at output 208 of clock 210. There are 20 outputs to register 206 with the least significant bit appearing at output 212 and the most significant bit appearing at output 214. Thus, in the first clock cycle the bits are loaded in beginning at 212 and shift upwardly within the illustration of FIG. 4a. The first three bit outputs of register 206 beginning with the least significant bit at output 212 are coupled to logic gate 300.

Gates 300 form a logical combination which has their inputs coupled to the first three bits of the word assembled in register 206. These first three bits are the synchronization bits of the 1553 MUX word as coded in NRZ-L. It can be easily verified that the logical combination of gates 300 will create an active low pulse to the inverted clock input of flip-flop 302 on each occasion that a synchronization bit is decoded whether it be a status and command word or a data word. Therefore, flip-flop 300 is clocked each time a new 1553 MUX word is in place in register 206.

Thus, whenever a synchronization command or synchronization data prefix is received a clock signal will be generated by logic combination 300 to the low active and clock input 302 of JK flip-flop 304. Thus, when a clock pulse is received, indicating that a command or data synchronization has been received, inverted Q output 306 will go active high. Output 306 is coupled to the reset inputs 308 of counter 310. Counter 310 in turn is driven by a 2-MHz clock signal at output 216 of clock 210 after inversion by NOR gate 312. Counter 310 counts to 39 at the 2-MHz rate which is equal to 19½ data bit intervals at the 1-MHz rate. A combination of logic gates is coupled to the outputs of counter 310. These gates determine when the 39th count has occurred in order to reset the counter and generate a SHIFT/LOAD command signal.

For example, NAND gate 314 will provide an active low reset signal to reset input 316 of JK flip-flop 304 only when both of its inputs are high. The inputs of NAND gate 314 will be high only when both the output of AND gate 318 and 320 are high. The inputs to NAND gate 320 are the two lowest order bits of counter 310. The inputs to AND gate 318 are the third and fifth highest bits within counter 310. Therefore a reset signal will be generated whenever the count 100 111 has been achieved, or the decimal count equal to 39.

Similarly, NAND gate 322 has its output coupled to the highest order bit of counter 310 (representing the decimal numeral 32) and to the output of AND gate 320. The SHIFT/LOAD signal, the output of NAND gate 322, will thus to high when the count reaches at least 35 and will remain high until count 39.

Meanwhile, during the 40 counts after the beginning receipt of a command data word, data will be fully loaded in register 206 and presented to the inputs of register 208. The most significant bits, synchronization bits, will be coupled to lines 218, 220 and 222 as the bits have been shifted upwardly within register 206. The remaining 17 bits represent the 16 bits of data and the parity bit. Each of the data bits and parity bit, each corresponding to a single output line from register 206, is coupled to a pair of input lines in register 208.

For example, consider the most significant data bit (MSB) on line 224. Line 224 couples the MSB data output bit from register 206 to an input 226 and 228 corresponding to the 7th and 8th most significant bits stored within register 208. Line 224 is coupled to input 226 through an inverter 230 while the coupling to input 228 is a direct wire connection. Thus, each of the data bits and parity bit and its complement is coupled to successive inputs within register 208. The data signal 1001, for example, if that were the three most significant bits of the NRZ-L data portion, in register 206 would appear behind the synchronization bits as the 6 bits, 100110.

Synchronization bits on lines 218–222 are similarly coupled to the six most significant bits within register 208, however there is no inversion among the pairs. Therefore a synchronization prefix represented by the signal 100 appears in the three most significant bits of register 208 simply as 110000.

Register 208 is clocked by a 2-MHz clock signal from clock 210. The signals stored register 208 is provided simultaneously to the inputs of an AND gate 232 which acts as a buffer and NOR gate 234 which acts as an inverter. The output of AND gate 232 in turn is coupled to the input of a NOR gate 236. Similarly, the output of NOR gate 234 is coupled to one input of a NOR gate 238. The opposing input of NOR gates 236 and 238 are each coupled to a synchronization clock signal generated by circuitry described below.

A second counter 326 is also driven in a countdown mode by the output of NOR gate 312, namely by the inverted 2-MHz clock signal. Counter 32 will thus begin counting down 39 counts and will produce a count pulse on the 39th count, which is coupled to the active low clock input 328 of a JK flip-flop 330. The J input is held high and the K input is held low. Thus, Q output 332 of flip-flop 330, which is normally reset to zero, will go high upon receipt of a clock pulse representative of the 39th count. In addition, on the 39th count the SHIFT/LOAD signal will be produced at the output 324 of gate 322 which will serve to reload counter 326 which will begin the countdown process again. Output 324 is coupled to the load inputs 334 of counter 326. Similarly, JK flip-flop 330 will be reset by the SHIFT/LOAD signal by virtue of the coupling of gate 322 to the reset active low terminal 236 of flip-flop 330.

Q output 332 of flip-flop 330 is coupled to the D input 338 of flip-flop 340. Flip-flop 340 in turn is clocked by the 2-MHz signal from output 216. Therefore, on the 39th pulse of the 2-MHz train following the beginning of a synchronization word, or some multiple thereof, the Q output 342 of flip-flop 340 will be clocked high. This will provide an inhibit signal to NOR gates 236 and 238. Otherwise, JK flip-flop 330 will be reset low permitting the words stored within register 208 to be serially clocked through gates 236 and 238 into a conventional AC biphased bus driver 344 which is transformer coupled through transformer 346 to 1553 MUX bus 348.

Consider now how the above described circuitry assembles the NRZ-L data within register 206 into Manchester data including resynthesis of the Manchester invalid synchronization prefix. Return to the diagram of FIG. 5. Assuming the NRZ-L word as depicted in line 34 to have been assembled within register 206, the word as depicted in line 418 will then be assembled. This word is then clocked out at a 2-MHz cycle and will appear at the inputs to the bus driver as the word at line 40 which is Manchester code.

Thus, as soon as a command or data word is recognized 19½ data intervals are counted. During this time the word is being assembled in parallel format within register 206. On the 40th count at the beginning of the 20th data interval, the word is fully assembled and presented at the inputs of register 208. Counter 310 then generates a SHIFT/LOAD signal at output 324 which resets the command/status recognition circuitry comprising flip-flop 304 and hence counter 310. At this point counter 326 is loaded and begins its countdown for 19½ data intervals. During countdown Q output 342 of flip-flop 340 is low and therefore NOR gates 236 and 238 are enabled, thereby allowing the Manchester code to be serially output to the MUX bus.

Meanwhile register 206 and logic gates 300 wait until the next word, which may arrive as little as two microseconds or two bit intervals after the last word or as much as 2 milliseconds or 2 thousand bit intervals later. Therefore, it is possible that after a brief gap the next word will be recognized by logic circuit 300 and begin to be assembled in register 206 while the preceding word is being serially output from register 208.

In any case the data and data gaps are perfectly reproduced but transformed into Manchester code including the Manchester invalid synchronization prefix. The synchronization prefix is resynthesized as follows. The three most significant bit inputs of register 208 are coupled in common to line 218. The fourth most significant bit input is coupled to line 220. However, the fifth and sixth most significant bit inputs of register 208 are coupled to line 222 in common. Therefore, according to the NRZ-L formatted word, the most significant bit, i.e., coupled to line 218, will be output on the first three one-half data bit intervals from register 208 at the 2-MHz rate. The fourth bit or the last one-half bit interval, is then output according to the second most significant bit of the NRZ-L formatted synchronization prefix. Finally, the last bit intervals corresponding to the fifth and sixth bits within register 208 is coupled out in the last and third data bit interval of the synchronization bit. These bits, coupled to line 222, correspond to the third most significant bit of the NRZ-L formatted word. In this manner the forwardly shifted synchronization prefix in the NRZ-L format is resynthesized into the original invalid Manchester synchronization format as first recorded in the 1553 MUX bus 40A and B as shown in FIG. 3a.

Many modifications and alterations may be made by those having ordinary skill in the art without departing from the spirit and scope of the invention. For example, although the illustrated embodiment has contemplated a recordal of the synthesized data on magnetic tape, it is expressly contemplated that transmittal of the data by other means is included such as is well known in the field of telemetry. The illustrated embodiment has been set forth only for the purposes of example and should not be taken as limiting the invention as defined in the following claims.

I claim:

1. A circuit for encoding a digital signal comprising multiple words on a bus, said digital signal coded in a first bit format at a first data rate, each word including a synchronization portion coded in a bit format invalid in said first bit format, a data portion, and a parity portion, and at least one gap portion between said multiple words, said circuit comprising:
   encoder means for converting a selected portion said digital signal into a synthesized digital signal coded in a second bit format at a second data rate, said second data rate being asynchronous to said first data rate, said selected portion not including said synchronization portion, said first data rate being greater than said second data rate;
   synthesis means for synthesizing a new synchronization portion of said synthesized digital signal from said synchronization portion of said digital signal according to a predetermined protocol, and for inserting data in said predetermined protocol in said gap, said new synchronization portion being written into and across said gap, said synthesis means coupled to said encoder means; and
   means for recording said synthesized digital signal on a single track of magnetic tape at said lower second data rate, said means for recording coupled to said encoder means and synthesis means,
   whereby said data originally generated at said higher first data rate is synthesized to include said invalid synchronization portion in a format characterized by a reduced second data rate so that said means for recording said synthesized digital signal has a substantially lower frequency capability corresponding to said second data rate.

2. The circuit of claim 1 further comprising:
   decoder means for converting said digital signal in said second bit format of reduced second data rate into said first bit format of said higher originating first data rate; and
   resynthesis means coupled to said decoder means for resynthesizing said synchronization portion in said invalid bit format, said decoder means being coupled to said means for recording,
   whereby data at said original higher first data rate may be recorded by said means for recording and reconverted into said original format so that processing of recorded data is independent of said means for recording said data.

3. The circuit of claim 2 wherein said resynthesis means comprises:
   means for recognizing said synthesized synchronization portion; and
   means for resynthesizing said synchronization portion in said invalid bit format at said higher first data rate, said means for resynthesizing said invalid synchronization portion being coupled to said means for recognizing.

4. The circuit of claim 3 wherein said resynthesizing means resynthesizes said synchronization portion by shifting logic transitions within said synchronization portion back to said original first bit format.

5. The circuit of claim 2 wherein said resynthesizing means resynthesizes said synchronization portion by shifting logic transitions within said synchronization prefix back to said original first bit format.

6. The circuit of claim 1 wherein said synthesis means comprises:
   means for recognizing a synchronization portion;

means for synthesizing a new synchronization portion in said second bit format corresponding to said invalid synchronization portion, said means for synthesizing coupled to said means for recognizing said synchronization portion and being responsive to said means for recognizing, said means for synthesizing synthesizing said new synchronization portion in said second bit format.

7. The circuit of claim 6 wherein said synthesis means generates a new synchronization portion in said new second bit format according to a predetermined shift the timing of transition of logic levels within said synchronization portion inserted according to said predetermined protocol in said gap, said new synchronization portion being written into said gap.

8. The circuit of claim 1 wherein said synthesis means generates a new synchronization portion in said. new second bit format according to a predetermined shift in the timing of transition of logic levels within said synchronization portion inserted according to said predetermined protocol in said gap, said new synchronization portion being written into said gap.

9. A circuit for encoding a digital signal on a bus coded in a first format at a first data rate, said digital signal being coded according to said first format and including a synchronization portion coded in a format invalid in said first format, said circuit comprising:
  encoder means for converting a selected portion said digital signal into a synthesized digtal signal coded in a second format at a second data rate, said selected portion not including said synchronization portion, said first data rate being greater than said second data rate;
  synthesis means for synthesizing a new synchronization portion of said synthesized digital signal from said synchronization portion of said digital signal according to a predetermined protocol, said synthesis means coupled to said encoder means; and
  means for recording said synthesized digital signal, said means for recording coupled to said decoder means and synthesis means,
  wherein said encoder means comprises:
  a first encoder for converting signals in a Manchester coded format on a 1553 MUX bus into NRZ-L formatted signals; and
  a second encoder coupled to said first encoder, said second encoder for converting said NRZ-L formatted data into DM-M formatted data run at said reduced second data rate as compared to said first data rate of said Manchester and NRZ-L formatted signals,
  whereby said data originally generated at said higher first data rate is synthesized to include said invalid synchronization portion in a format characterized by a reduced second data rate so that said means for recording said synthesized digital signal has a substantially lower frequency capability corresponding to said second data rate.

10. The circuit of claim 9 wherein said synthesis means comprises:
  means for recognizing a synchronization portion;
  means for synthesizing a new synchronization portion in said second coded format corresponding to said invalid synchronization portion, said means for synthesizing coupled to said means for recognizing said synchronization portion and being responsive to said means for recognizing to synthesize said new synchronization portion in said second coded format.

11. The circuit of claim 10 wherein said synthesis means generates a new synchronization portion in said new second bit format according to a predetermined shift in the timing of transition of logic levels within said synchronization prefix inserted according to said predetermined protocol in said gap, said new synchronization portion being written into said gap.

12. A circuit for encoding a digital signal on a bus coded in a first format at a first data rate, said digital signal being coded according to said first format and including a synchronization portion coded in a format invalid in said first format, said circuit comprising:
  encoder means for converting a selected portion said signal into a synthesized digital signal coded in a second format at a second data rate, said selected portion not including said synchronization portion, said first data rate being greater than said second data rate;
  synthesis means for synthesizing a new synchronization portion of said synthesized digital signal from said synchronization portion of said digital signal according to a predetermined protocol, said synthesis means coupled to said encoder means; and
  means for recording said synthesized digital signal, said means for recording coupled to said decoder means and synthesis means,
  decoder means for converting said digital signal in said second format of reduced second data rate into said first format of said higher originating first data rate; and
  resynthesis means coupled to said decoder means for resynthesizing said synchronization portion in said invalid format, said decoder means being coupled to said means for recording,
  wherein said decoder means comprises:
  a first decoder for reconverting said digital signal from DM-M code format at said second data rate into NRZ-L format at said first data rate; and
  a second decoder for reconverting said NRZ-L format digital data into said Manchester coded data at said first data rate,
  whereby said data originally generated at said higher first data rate is synthesized to include invalid synchronization portion in a format characterized by a reduced second data rate so that said means for recording said synthesized digital signal has a substantially lower frequency capability corresponding to said second data rate and whereby data at said original higher first data rate may be recorded by said means for recording and reconverted into said original format so that processing of said data appears to be independent of said means for recording said data.

13. The circuit of claim 12 wherein said resynthesis means comprises:
  means for recognizing said synthesized synchronization portion; and
  means for resynthesizing said synchronization portion in said invalid code format at said higher first clock rate, said means for resynthesizing said invalid synchronization potion being coupled to said means for recognizing.

14. The circuit of claim 13 wherein said resynthesizing means resynthesizes said synchronization portion by shifting logic transitions within said synchronization portion back to said original first coded format.

15. A circuit for encoding a digital signal on a bus coded in a first format at a first data rate, said digital signal being coded according to said first format and including a synchronization portion coded in a format invalid in said first format, said circuit comprising:
  encoder means for converting a selected portion said digital signal into a synthesized digital signal coded in a second format at a second data rate, said selected portion not including said synchronization portion, said first data rate being greater than said second data rate;
  synthesis means for synthesizing a new synchronization portion of said synthesized digital signal from said synchronization portion of said digital signal according to a predetermined protocol, said synthesis means coupled to said encoder means; and
  means for recording said synthesized digital signal, said means for recording coupled to said decoder means and synthesis means,
  wherein said synthesis means comprises:
  means for recognizing a synchronization portion;
  means for synthesizing a new synchronization portion in said second coded format corresponding to said invalid synchronization portion, said means for synthesizing coupled to said means for recognizing said synchronization portion and being responsive to said means for recognizing to synthesize said new synchronization portion in said second coded format,
  wherein said means for recognizing said synchronization portion comprises a flip-flop coupled to said encoder means, said flip-flop assuming a first logic state upon receipt of a signal representative of a command synchronization portion and assuming a second logic state upon receiving a signal representative of a data synchronization portion; and
  wherein said means for synthesizing said new synchronization portion comprises an output register coupled to said encoder means wherein said new format digital word is stored within said register and wherein a selected portion of said register is reserved for said new synchronization portion, said selected portion of said register being coupled to said output of said flip-flop in a predetermined mapping between said selected bit portions of said register and said outputs of said flip-flop,
  whereby said data originally generated at said higher first data rate is synthesized to include said invalid synchronization portion in a format characterized by a reduced second data rate so that said means for recording said synthesized digital signal has a substantially lower frequency capability corresponding to said second data rate.

16. A circuit for encoding a digital signal on a bus coded in a first format at a first data rate, said digital signal being coded according to said first format and including a synchronization portion coded in a format invalid in said first format, said circuit comprising:
  encoder means for converting a selected portion said digital signal into a synthesized digital signal coded in a second format at a second data rate, said selected portion not including said synchronization portion, said first data rate being greater than said second data rate;
  synthesis means for synthesizing a new synchronization portion of said synthesized digital signal from said synchronization portion of said digital signal according to a predetermined protocol, said synthesis means coupled to said encoder means; and
  means for recording said synthesized digital signal, said means for recording coupled to said decoder means and synthesis means,
  decoder means for converting said digital signal in said second format of reduced second data rate into said first format of said higher originating first data rate; and
  resynthesis means coupled to said decoder means for resynthesizing said synchronization portion in said invalid format, said decoder means being coupled to said means for recording,
  wherein said resynthesis means comprises:
  means for recognizing said synthesized synchronization portion; and
  means for resynthesizing said synchronization portion in said invalid code format at said higher first data rate, said means for resynthesizing said invalid synchronization portion being coupled to said means for recognizing,
  wherein said means for recognizing said synthesized synchronization portion comprises a register and a plurality of logic gates coupled to selected bit outputs of said register, said synthesized synchronization portion having a predetermined logic pattern, said plurality of logic gates generating an output signal in response to the occurrence of said predetermined logic pattern on said selected ones of bit outputs of said register; and
  wherein said means for resynthesizing said invalid synchronization portion comprises a register having a plurality of bit input terminals, each bit input terminal corresponding to a predetermined fraction of a data bit interval, selected ones of said bit input terminals being provided with corresponding logic levels from said new synchronization portion according to an inverse of said predetermined logic pattern,
  whereby said data originally generated at said higher first data rate is synthesized to include said invalid synchronization portion in a format characterized by a reduced second data rate so that said means for recording said synthesized digital signal has a substantially lower frequency capability corresponding to said second data rate, and whereby data at said original higher first data rate may be recorded by said means for recording and reconverted into said original format so that processing of said data appears to be independent of said means for recording said data.

17. A method for conveying multiple words of digital data generated at a first site, each said word of said digital data being encoded according to a first selected bit format, each word including a synchronization portion and separated from a sequentially adjacent word by a gap, said synchronization portion having a bit format logically distinct from the bit format with respect to the remaining portion of each said word, said synchronization portion being defined in a bit format incompatible with the bit format of the remaining portion of said word, said method comprising the steps of:
  converting all of said digital data in said first bit format into a second bit format;
  synthesizing said invaid synchronization portion into a synchronization portion in a formatted code logically consistent with said second bit format, said synthesis being made according to a predetermined protocol, said second bit format being driven by a data frequency reduced as compared to that of said first bit format;

inserting said synthesized synchronization portion in said second bit format according to said predetermined protocol in and across said gap, said new synchronization portion being written into said gap;

conveying said digital information in said second bit format to a second site;

reconverting said digital information in said second bit format into said first bit format; and resynthesizing said synchronization portion in said second bit format into said first bit format according to an inverse of said predetermined protocol, whereby said digital information is conveyed between said first and second sites and is converted from and reconverted into said first bit format in a manner substantially independent of all of said steps of said method.

18. A method for conveying digital data generated at a first site, said digital data being encoded according to a first selected format, said format being organized into a plurality of words, each word including a synchronization portion, said synchronization portion having a code format logically distinct from the coding format with respect to the remaining portion of each said word, said synchronization portion being defined in an invalid format, said method comprising the steps of:

converting all of said digital data in said first coded format into a second coded format;

synthesizing said invalid synchronization portion into a synchronization portion in a formatted code logically consistent with said second coded format, said synthesis being made according to a predetermined protocol, said second coded format being driven by a data frequency reduced as compared to that of said first coded format;

conveying said digital information in said second coded format to a second site;

reconverting said digital information in said second coded format into said first coded format; and resynthesizing said synchronization portion in said second coded format into said first coded format according to an inverse of said predetermined protocol, wherein said step of converting said digital information into said second coded format comprises the steps of converting said digital information into NRZ-L coded format, wherein said step of synthesizing said synchronization word comprises the step of synthesizing a corresponding synchronization portion to said word in said NRZ-L format; and converting said synchronization portion and remaining portion of said word in NRZ-L format into DM-M format; and wherein said step of reconverting said digital information from said second coded format to said first coded format comprises the steps of converting said information in DM-M coded format into NRZ-L coded format, identifying said synchronization portion, and resynthesizing said synchronization portion thus identified into said first coded format according to said predetermined protocol, whereby said digital information is conveyed between said first and second sites and is converted from and reconverted into said first coded format in a manner substantially independent of all of said steps of said method.

* * * * *